United States Patent
Sakae et al.

(10) Patent No.: US 8,760,211 B2
(45) Date of Patent: Jun. 24, 2014

(54) LEVEL CONVERTER AND PROCESSOR

(71) Applicant: Fujitsu Limited, Kawasaki (JP)

(72) Inventors: Tatsuya Sakae, Kawasaki (JP);
Yasutaka Kanayama, Inagi (JP);
Noriyuki Tokuhiro, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 13/623,404

(22) Filed: Sep. 20, 2012

(65) Prior Publication Data

US 2013/0076428 A1 Mar. 28, 2013

(30) Foreign Application Priority Data

Sep. 26, 2011 (JP) .................................. 2011-209914

(51) Int. Cl.
*H03L 5/00* (2006.01)

(52) U.S. Cl.
USPC ................................ 327/333; 326/62; 326/81

(58) Field of Classification Search
USPC .................. 326/62–63, 80–81; 327/306, 333
See application file for complete search history.

(56) References Cited

U.S. PATENT DOCUMENTS 7,839,170 B1 * 11/2010 Yang et al. ...................... 326/68
8,476,937 B2 * 7/2013 Em .................................. 327/77

FOREIGN PATENT DOCUMENTS

JP 2004-356779 12/2004

* cited by examiner

*Primary Examiner* — Dinh T. Le
(74) *Attorney, Agent, or Firm* — Staas & Halsey LLP

(57) ABSTRACT

A level converter includes a level conversion circuit, which is provided between a reference power supply line having a reference voltage level and a first power supply line coupled to a first power supply outputting a first voltage level, which inputs a first signal and outputs a second signal, the first signal having a first logic level and a second logic level, the second signal having a first logic level and a second logic level; a control signal generating circuit to output a control signal having the reference voltage level when a second power supply outputting the second voltage level is turned off and the first voltage level when the second power supply is turned on; and a coupling circuit to control an electrically connection between the first power supply line and an output node of the level conversion circuit based on the control signal.

20 Claims, 12 Drawing Sheets

316

LEVEL CONVERTER AND PROCESSOR

CROSS-REFERENCE TO RELATED APPLICATIONS

This application is based upon and claims the benefit of priority of the prior Japanese Patent Application No. 2011-209914, filed on Sep. 26, 2011, the entire contents of which are incorporated herein by reference.

FIELD

The embodiments discussed herein are related to a level converter and a processor.

BACKGROUND

In general, when signals are transmitted and received to and from two LSIs operating with different amounts of power supply voltage, voltage levels of the signals handled by the two LSIs differ from each other. Therefore, the LSI with the low power supply voltage is provided with a level converter that converts the voltage level of the signal, which is be output to the LSI with the higher power supply voltage, into the higher power supply voltage from the low power supply voltage.

FIG. 1 is a diagram illustrating an example of a circuit configuration of a level converter. A level converter 100 illustrated in FIG. 1 includes a level conversion circuit 102, an inverters 104, 106, and 108, and a transistor 110 for power supply sequence control.

In the level converter 100, the level conversion circuit 102, which is provided between a high voltage power supply line HVDD and a ground power supply line GND, receives a non-inverted signal and an inverted signal of an input signal, which is supplied to an input node INPUT through the inverters 104 and 106, as a differential input. At this time, the input signal has an H level ("1") for a power supply voltage level LVL of a low voltage power supply line LVDD and an L level ("0") for a ground level GVL of the ground power supply line GND. The power supply voltage level LVL of the low voltage power supply line LVDD is lower than a power supply voltage level HVL output from the high voltage power supply line HVDD.

The level conversion circuit 102 converts the input signal into a signal of which the power supply voltage level HVL of the high voltage power supply line HVDD is the H level ("1") and of which a ground level GVL is the L level ("0") and outputs the signal of which the voltage level corresponding to each logic level is converted. An output node LVOUT of the level conversion circuit 102 is coupled to the input node of the inverter 108. The inverter 108 inverts the output signal from the output node LVOUT of the level conversion circuit 102 and supplies the inversed signal as an output signal of the level converter 100 to an output node OUTPUT.

The level converter 100 is coupled to the high voltage power supply line HVDD to which a power supply voltage level HVL is supplied from the high voltage power supply and to the low voltage power supply line LVDD to which a power supply voltage level LHL is supplied from the low voltage power supply and operates based on those power supply voltages. The level converter 100 is desired to operate normally regardless the sequence of the above-described two power supplies to be supplied. That is, the level converter 100 is desired to be power supply sequence free.

To be power supply sequence free, the level converter 100 includes the transistor 110 for power supply sequence control. The transistor 110 is, for example, a P-channel transistor provided between the high voltage power supply line HVDD and the output node LVOUT of the level conversion circuit 102. A gate of the transistor 110 is coupled to the low voltage power supply line LVDD.

FIGS. 2A and 2B are timing charts illustrating an operation of the level converter 100 at a time of supplying power. When the high voltage power supply and the low voltage power supply are supplied, the high voltage power supply is turned on before the low voltage power supply. During a power-on period T1 in which the low voltage power supply is turned off while the high voltage power supply is turned on, the transistor 110 is turned on because the input signal of the ground level GVL (L level) is input into the gate. Therefore, as illustrated in FIG. 2A, the transistor 110 electrically couples the output node LVOUT of the level conversion circuit 102 to the high voltage power supply line HVDD and fixes the voltage level of the output node LVOUT to the power supply voltage level HVL of the high voltage power supply line HVDD. Due to this, the voltage level of the output signal of the output node OUTPUT is fixed to the ground level GVL.

Accordingly, regarding the level converter 100, even when the low voltage power supply is turned off while the high voltage power supply is turned on, a signal of which the voltage level is unstable is input from the output node OUTPUT into a latter stage circuit with the identical high voltage power supply as an operation power supply voltage. This prevents the latter stage circuit from malfunctioning and a through current from being generated in the latter stage circuit.

Japanese Laid-open Patent Publication No. 2004-356779 discloses a technique for preventing the through current from being generated in an output driver by putting a transistor, which has the output driver to which an output signal from a level shifter is supplied, in a cut-off state while the low voltage power supply is not operating.

On the other hand, in a normal operation period T2 of the level converter 100 where both the high voltage power supply and the low voltage power supply are turned on, the signal of the power supply voltage level LVL (H level) is input into the gate of the transistor 110 from the low voltage power supply line LVDD. Due to this, although the level converter 100 tries to turn off the transistor 110, the voltage level of the source of the transistor 110 is the power supply voltage level HVL of the high voltage power supply line HVDD, and the voltage level of the source of the transistor 110 indicates a potential between the voltage level and the ground level. Thus, the transistor 110 may not be completely turned off. Therefore, the transistor 110 may not completely separate the output node LVOUT of the level conversion circuit 102 from the high voltage power supply line HVDD.

As illustrated in FIG. 1, in the normal operation period T2, regarding the level conversion circuit 102, a through current ID flows between the high voltage power supply line HVDD and the ground power supply line GND through the transistors 110 and 112 at a timing when the transistor 112 provided between the output node LVOUT and the ground power supply line GND is turned on. Regarding the level converter 100, consumption current increases due to the through current ID. As a result, there is a problem that the consumption power increases.

For example, as illustrated in FIG. 2B when the power supply voltage level of the high voltage power supply line HVDD is 1.50V and when the power supply voltage level of the low voltage power supply line LVDD is 0.85V, the voltage level of the gate of the transistor 110 indicates an intermediate potential that is as high as half the voltage level of the source.

Due to this, the transistor 110 is not completely turned off (HVL=1.50V, LVL=0.85V). Therefore, when the voltage level of the input signal is the H level (LVL), the transistor 112 is turned on. Thus, the through current ID flows. Although the signal of the H level (HVL) is output from the output node, the voltage level of the output node LVOUT does not reach 0V (ground level GVL) due to influence of a voltage decrease generated in the transistor 110 caused by the through current ID.

In general, the LSI includes many output terminals.

The level converter 100 illustrated in FIG. 1 is provided for each of the output terminals. That is, since the number of level converters 100 is similar to the number of output terminals of the LSI, the through current of the whole LSI caused by the level converter 100 increases according to the number of output terminals of the LSI. Therefore, even if the through current value of a single level converter 100 is small, the through current of the whole LSI increases. This causes an increase of the consumption power of the LSI. Since the number of output terminals of the LSI has increased in recent years, the increase of the consumption power of the LSI caused by the through current of the level converter 100 has been a large obstacle in power saving of the whole LSI.

In the above-described case, if the gate length of the transistor 110 is longer than the gate length of each transistor included in the level conversion circuit 102, the value of the current flowing in the transistor 110 may be reduced by increasing the resistance value of the transistor 110 in the above-described normal operation period T2. In this case, however, the through current may not be eliminated.

SUMMARY

According to an aspect of the invention, a level converter includes a reference power supply line which has a reference voltage level; a level conversion circuit which has an output node, which is provided between the reference power supply line and a first power supply line, which inputs a first signal and outputs a second signal from the output node, the first power supply line being coupled to a first power supply outputting a first voltage level that is higher than the reference voltage level, the first signal having a first logic level that is a second voltage level that is lower than the first voltage level and is higher than the reference voltage level, and a second logic level that is the reference voltage level and is lower than the first logic level, the second signal having a first logic level that is the first voltage level and a second logic level that is the reference voltage level; a control signal generating circuit to output a control signal, the control signal having the reference voltage level when a second power supply outputting the second voltage level is turned off and the first voltage level when the second power supply is turned on; and a coupling circuit to control an electrically connection between the first power supply line and the output node of the level conversion circuit based on the control signal.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

The embodiments of the present invention will be described below.

[1. First Embodiment]

A level converter and a processor according to a first embodiment will be described.

[1-1. Level Converter]

Figure 3:
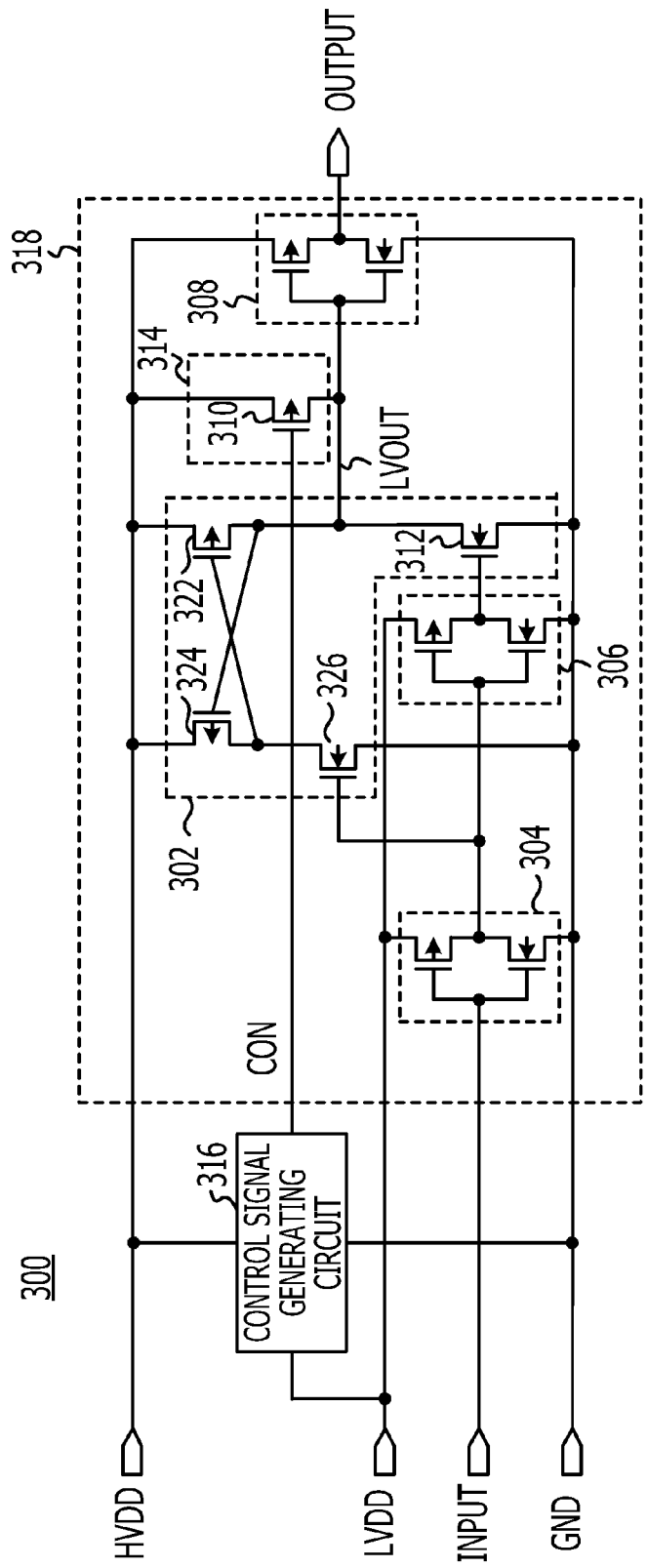
FIG. 3 is a diagram illustrating an example of a circuit configuration of a level converter according to a first embodiment.

A configuration of the level converter according to the first embodiment will be described. FIG. 3 is a diagram illustrating an example of a circuit configuration of the level converter according to the first embodiment.

As illustrated in FIG. 3, a level converter 300 includes a control signal generating circuit 316 and a level conversion processing unit 318. The level conversion processing unit 318 includes a level conversion circuit 302, inverters 304, 306, and 308, and a coupling circuit 314 for power supply sequence control. The coupling circuit 314 for power supply sequence control includes a transistor 310 for power supply sequence control.

In the level conversion processing unit 318, the level conversion circuit 302 is coupled to a high voltage power supply and provided between a high voltage power supply line HVDD, to which a power supply voltage level HVL is supplied from the high voltage power supply, and a ground power supply line GND with a ground level GVL. The ground power supply line GND functions as a reference power supply line that has the reference voltage level. The level conversion circuit 302 receives, through the inverter 304, an inverted signal of an input signal supplied to an input node INPUT of the level converter 300 and also receives, through the inverter 306, a non-inverted signal of the input signal supplied to the input node INPUT. That is, the level conversion circuit 302 receives the non-inverted signal and the inverted signal of the input signal supplied to the input node INPUT as a differential input.

At this time, regarding the input signal, the power supply voltage level LVL supplied from the low voltage power supply line LVDD is the H level ("1"), and the ground level GVL of the ground power supply line GND is the L level ("0"). The low voltage power supply line LVDD is coupled to the low voltage power supply and is supplied with the power supply voltage level LVL from the low voltage power supply. The power supply voltage level LVL of the low voltage power supply line LVDD is higher than the ground level GVL and lower than the power supply voltage level HVL of the high voltage power supply line HVDD. For example, the power supply voltage level LVL is 0.85V, and the power supply voltage level HVL is 1.5V or 1.35V.

The level conversion circuit 302 includes a P-channel transistor 322, a P-channel transistor 324, an N-channel transistor 312, and an N-channel transistor 326. Regarding the P-channel transistor 322, the source is coupled to the high voltage power supply line HVDD, and the drain is coupled to an output node LVOUT of the level conversion circuit 302. Regarding the P-channel transistor 324, the source is coupled to the high voltage power supply line HVDD, the drain is coupled to the gate of the P-channel transistor 322, and the gate is coupled to the drain of the P-channel transistor 322. Regarding the N-channel transistor 312, the drain is coupled to the output node LVOUT, and the source is coupled to the ground power supply line GND. Regarding the N-channel transistor 326, the drain is coupled to the drain of the P-channel transistor 324, and the source is coupled to the ground power supply line GND. The non-inverted signal of the input signal supplied to the input node INPUT is input into the gate of the N-channel transistor 312. The inverted signal of the input signal supplied to the input node INPUT is input into the gate of the N-channel transistor 326.

Based on the received input signal, the level conversion circuit 302 converts the input signal into a signal, of which the power supply voltage level HVL of the high voltage power supply line HVDD is the H level ("1") and the ground level GVL is the L level ("0"), and outputs the signal of which the voltage level corresponding to each logic level (H level and L level) is converted. The output node LVOUT of the level conversion circuit 302 is coupled to the input node of the inverter 308.

The inverter 308 inverts the output signal from the output node LVOUT of the level conversion circuit 302 and supplies the inversed signal as an output signal of the level converter 300 to the output node OUTPUT. The level converter 300 outputs the output signal of the inverter 308 from the output node OUTPUT to a latter stage circuit.

To be power supply sequence free, the level conversion processing unit 318 includes a coupling circuit 314 for power supply sequence control. The coupling circuit 314 is provided between the high voltage power supply line HVDD and the output node LVOUT of the level conversion circuit 302 and receives a control signal CON described below from the control signal generating circuit 316. In the example illustrated in FIG. 3, the coupling circuit 314 for power supply sequence control indicates a P-channel transistor 310 that is provided between the high voltage power supply line HVDD and the output node LVOUT and receives the control signal CON at the gate thereof.

The coupling circuit 314 controls whether to electrically couple the high voltage power supply line HVDD to the output node LVOUT of the level conversion circuit 302 according to the voltage level of the control signal CON. That is, regarding the P-channel transistor 310 that is provided as the coupling circuit 314 for power supply sequence control, when the voltage level of the control signal CON is the ground level GVL (L level), the P-channel transistor 310 is turned on and forms a conduction path between the high voltage power supply line HVDD and the output node LVOUT. Therefore, the P-channel transistor 310 electrically couples the high voltage power supply line HVDD to the output node OUT-PUT and fixes the voltage level of the output node LVOUT to the power supply voltage level HVL of the high voltage power supply line HVDD.

Since the voltage level of the input node of the inverter 308 is fixed to the power supply voltage level HVL, the level converter 300 may fix the voltage level of the output signal to the ground level GVL in the output node OUTPUT.

On the other hand, the P-channel transistor 310 provided as the coupling circuit 314 for power supply sequence control is turned off when the voltage level of the control signal CON is the power supply voltage level HVL (H level) of the high voltage power supply line HVDD and does not form the conduction path between the high voltage power supply line HVDD and the output node LVOUT. The P-channel transistor 310 electrically separates the high voltage power supply line HVDD from the output node LVOUT.

The control signal generating circuit 316 is provided between the high voltage power supply line HVDD and the ground power supply line GND and coupled to the low voltage power supply line LVDD. The control signal generating circuit 316 operates while the high voltage power supply coupled to the high voltage power supply line HVDD is turned on and generates the control signals CON with different voltage levels according to the voltage level of the low voltage power supply line LVDD. The control signal generating circuit 316 supplies the generated control signal CON to the P-channel transistor 310 provided as the coupling circuit 314.

The high voltage power supply outputs the power supply voltage level HVL to the high voltage power supply line HVDD in the ON state and outputs the ground level GVL in the OFF state. The low voltage power supply outputs the power supply voltage level LVL to the low voltage power supply line LVDD in the ON state and outputs the ground level GVL in the OFF state.

When the high voltage power supply and the low voltage power supply are in the ON state and when the voltage level of the low voltage power supply line LVDD is the power supply voltage level LVL, the control signal generating circuit 316 generates the control signal with the power supply voltage level HVL (H level) of the high voltage power supply line HVDD. When the high voltage power supply is in the ON state, the low voltage power supply is in the OFF state, and the voltage level of the low voltage power supply line LVDD is the ground level GVL, the control signal generating circuit 316 generates the control signal with the ground level GVL (L level).

Figure 4:
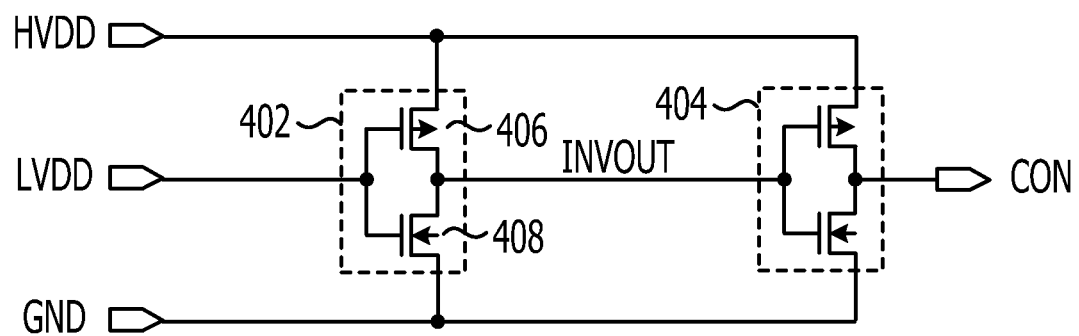
FIG. 4 is a diagram illustrating an example of a circuit configuration of a control signal generating circuit 316.

FIG. 4 is a diagram illustrating an example of a circuit configuration of the control signal generating circuit 316. As illustrated in FIG. 4, the control signal generating circuit 316 includes two inverters 402 and 404 provided between the high voltage power supply line HVDD and the ground power supply line GND. The inverter 402 in the first stage includes a P-channel transistor 406 and an N-channel transistor 408 provided in series between the high voltage power supply line HVDD and the ground power supply line GND. The inverter 402 includes the gate of the P-channel transistor 406 and the N-channel transistor 408 as the input node. The input node of the inverter 402 is coupled to the low voltage power supply line LVDD.

The inverter 402 receives the power supply voltage level LVL from the low voltage power supply line LVDD when the low voltage power supply is in the ON state and receives the ground level GVL when the low voltage power supply is in the OFF state. The power supply voltage level LVL that is input into the inverter 402 is lower than the power supply voltage level HVL of the high voltage power supply line HVDD coupled to the inverter 402 and indicates the level between the power supply voltage level HVL and the ground level GVL. Therefore, an inverse threshold value of the inverter 402 is set to be lower than the intermediate level between the power supply voltage level HVL and the ground level GVL in such a way that the inverter 402 recognizes the input of the power supply voltage level LVL of the low voltage power supply line LVDD as an input of the H level and outputs a signal with a voltage level, at which the inverter 404 in the next stage is able to recognize the input of the L level, in response to the input of the power supply voltage level LVL.

The above-described inverse threshold value may be set by making an on-resistance value between the P-channel transistor 406 and the N-channel transistor 408 included in the inverter 402 unbalanced and making the on-resistance of the P-channel transistor 406 larger than the on-resistance of the N-channel transistor 408. To make the on-resistance value between the P-channel transistor 406 and the N-channel transistor 408 unbalanced, the gate length of the transistor 406 is made longer than the gate length of the transistor 408. For example, the gate length of the transistor 406 is made as ten times longer as the gate length of the transistor 408. The on-resistance value also may be unbalanced by making the gate width of the transistor 406 narrower than the gate width of the transistor 408.

The inverter 402 outputs the L level to the inverter 404 in response to the input of the power supply voltage level LVL (H level) and outputs the H level to the inverter 404 in response to the input of the ground level GVL (L level).

The inverter 404 in the second stage receives the output signal of the inverter 402 and outputs the inverted signal of the received signal as the control signal CON.

Therefore, the control signal generating circuit 316 generates the control signal CON with the power supply voltage level HVL in response to the input of the power supply voltage level LVL (H level) and generates the control signal CON with the ground level GVL in response to the input of the ground level GVL (L level).

In the example illustrated in FIG. 4, the number of stages of the inverters of the control signal generating circuit 316 is 2. However, the number of stages of the inverters may be any even number. The control signal generating circuit 316 may be realized by an arbitrary even number of stages of inverters.

With reference to FIG. 5, an operation of the level converter 300 at a time of supplying the high voltage power supply and the low voltage power supply will be described below.

Figure 5A:
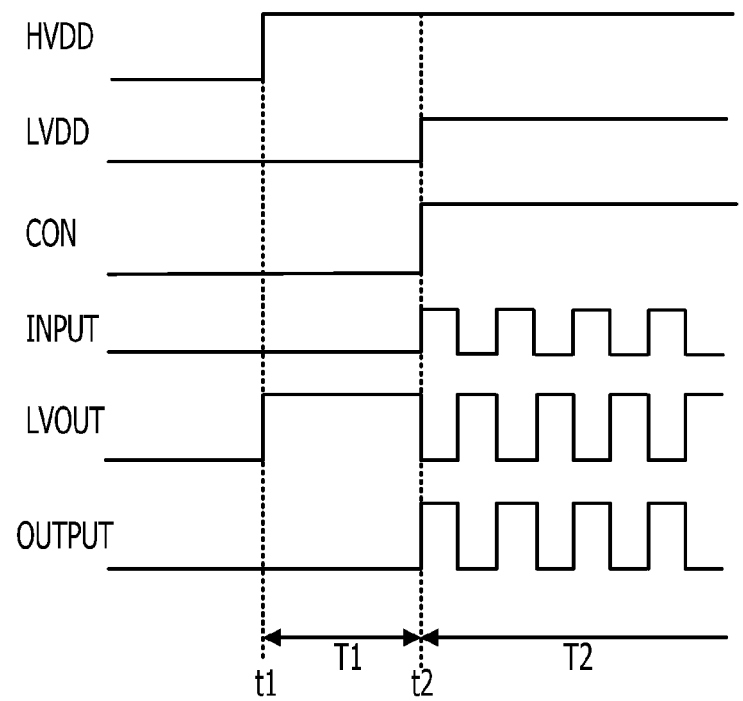
FIGS. 5A and 5B are a timing chart illustrating an operation of a level converter 300 at a time of supplying power.
Figure 5B:
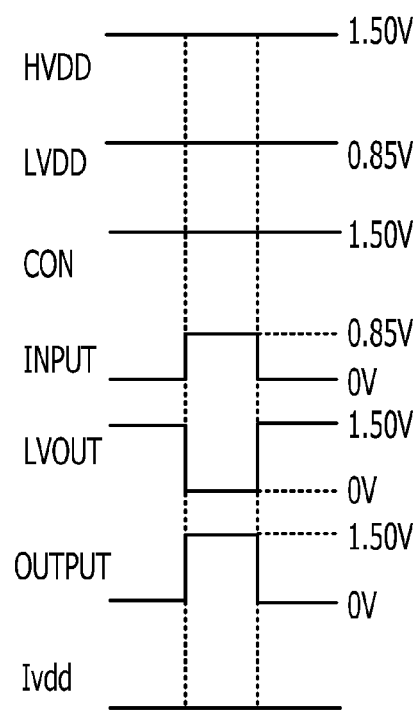

FIGS. 5A and 5B are a timing chart illustrating an operation of the level converter 300 at a time of supplying power. FIGS. 5A and 5B illustrate an example of a case where the high voltage power supply is turned on before the low voltage power supply at a time of supplying the high voltage power supply and the low voltage power supply. In the example illustrated in FIG. 5A, the high voltage power supply is turned on and the power supply voltage level HVL is output in a time t1, the low voltage power supply is turned on and the power supply voltage level LVL is output in a time t2 following the time t1.

As illustrated in FIG. 5A, in the power-on period T1 in which the high voltage power supply is turned on and the low voltage power supply is turned off, the signal of the ground level GVL is input into the control signal generating circuit 316. Thus, the control signal generating circuit 316 generates the control signal CON with the ground level GVL in response to the input of the ground level GVL (L level). The P-channel transistor 310 provided as the coupling circuit 314 is turned on as the signal of the ground level GVL (L level) is input into the gate thereof. Due to this, the transistor 310 electrically couples the output node LVOUT of the level conversion circuit 302 to the high voltage power supply line HVDD and fixes the voltage level of the output node LVOUT to the power supply voltage level HVL of the high voltage power supply line HVDD, so that the voltage level of the output signal of the output node OUTPUT is fixed to the ground level GVL.

Accordingly, in the level converter 300, even when the low voltage power supply is turned off while the high voltage power supply is turned on, the latter stage circuit may be prevented from malfunctioning and the through current may be prevented from being generated in the latter stage circuit if a signal of which the voltage level is unstable is input from the output node OUTPUT into the latter stage circuit with the similar high voltage power supply as the operation power supply voltage.

On the other hand, as illustrated in FIG. 5A, in a normal operation period T2 of the level converter 110 in which both the high voltage power supply and the low voltage power supply are turned on, a signal of the power supply voltage level HVL (H level) is input into the control signal generating circuit 316, so that the control signal CON with the power supply voltage level HVL is generated in response to the input of the power supply voltage level LVL (H level). Since the signal of the power supply voltage level HVL (H level) of the high voltage power supply line HVDD is input into the gate of the P-channel transistor 310 provided as the coupling circuit 314, the transistor 310 is turned off. At this time, both the voltage level of the source of the transistor 310 and the voltage level of the gate are the power supply voltage level HVL of the high voltage power supply line HVDD, so that the gate potential of the transistor 310 corresponds to the source potential. Thus, the level converter 300 may completely turn off the transistor 310. As a result, the transistor 310 may electrically and completely separate the output node LVOUT of the level conversion circuit 302 from the high voltage power supply line HVDD.

Therefore, for example, as illustrated in FIG. 5B, even when the power supply voltage level HVL of the high voltage power supply line HVDD is 1.50V and when the power supply voltage level LVL of the low voltage power supply line LVDD is 0.85V, the voltage level of the gate of the transistor 310 is 1.50V that is equal to the voltage level of the source, so that the transistor 310 is completely turned off (HVL=1.50V, LVL=0.85V). Accordingly, in the level conversion circuit 302, when the voltage level of the input signal is the H level (LVL), the through current is prevented from flowing between the high voltage power supply line HVDD and the ground power supply line GND through the transistors 310 and 312 even when the transistor 312 provided between the output node LVOUT and the ground power supply line GND is turned on. Since no voltage decrease is generated in the transistor 310 due to the through current, the voltage level of the output node LVOUT may be 0V (ground level GVL).

As described above, in the level converter 300, the high voltage power supply is in the ON state due to the control signal generating circuit 316 and the P-channel transistor 310 provided as the coupling circuit 314 for power supply sequence control. If the low voltage power supply is in the OFF state, the voltage level of the output node LVOUT of the level conversion circuit 302 is fixed to the power supply voltage level HVL of the high voltage power supply line HVDD, and the voltage level of the output node OUTPUT is fixed to the ground level GVL of the ground power supply line GND. When both the high voltage power supply and the low voltage power supply are in the ON state, the transistor 310 for power supply sequence control is completely turned off, and the through current is prevented from flowing through the transistor 310.

Accordingly, in the level convertor 300, the consumption current may be prevented from increasing by the through current due to the transistor provided as a coupling circuit for power supply sequence control. Thus, the consumption power is reduced compared to the level converter 100 illustrated in FIG. 1.

In the control signal generating circuit 316 illustrated in FIG. 4, when both the high voltage power supply and the low voltage power supply are in the ON state, the power supply voltage level LVL as a level between the power supply voltage level HVL and the ground level GVL is input into the inverter 402. Thus, neither the transistor 406 nor the transistor 408 is completely turned off. As a result, while the through current is prevented from flowing through the transistor 310, the through current flows between the high voltage power supply line HVDD and the ground power supply line GND through the inverter 402.

Figure 1:
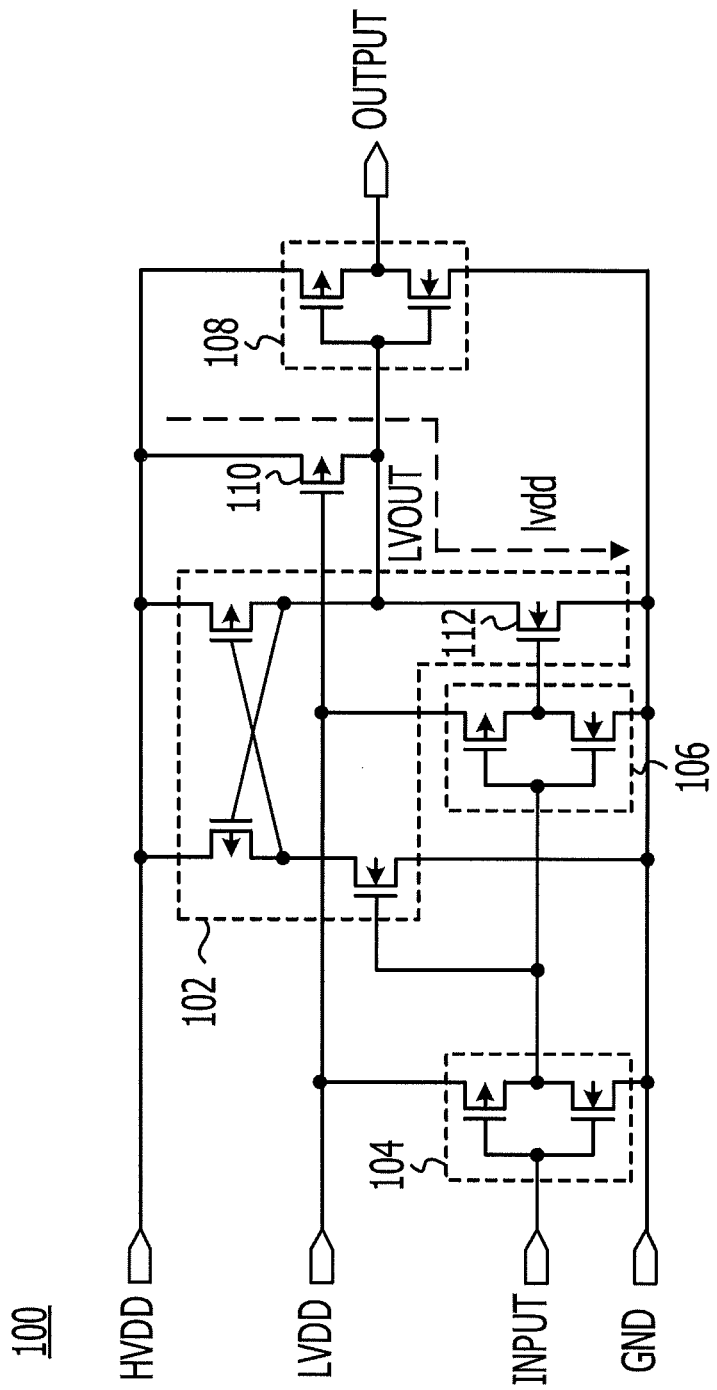
FIG. 1 is a diagram illustrating an example of a circuit configuration of a level converter.
Figure 2A:
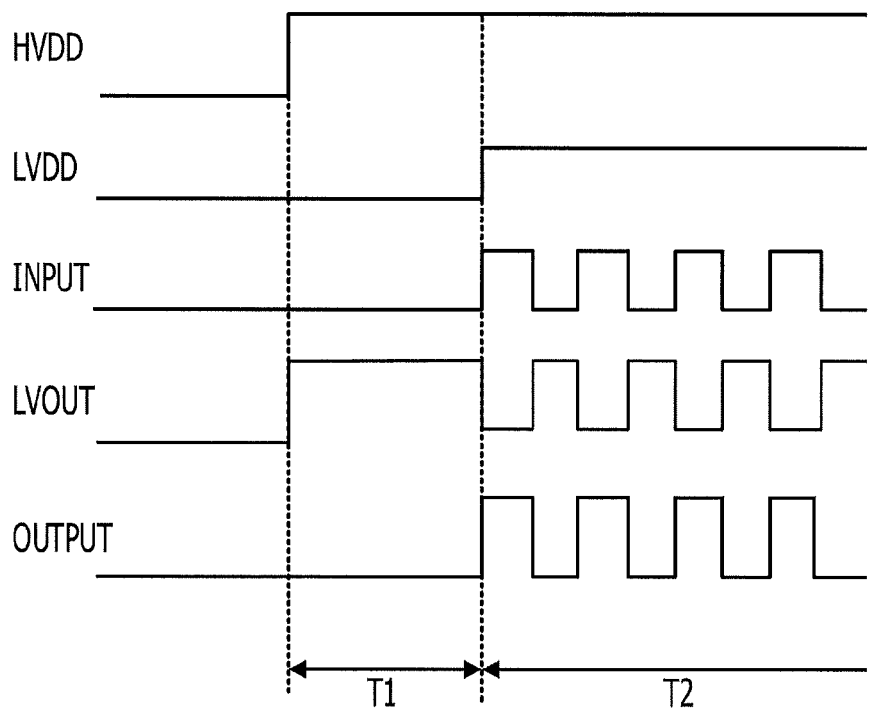
FIGS. 2A and 2B are a timing chart illustrating an operation of a level converter 100 at a time of supplying power.
Figure 2B:
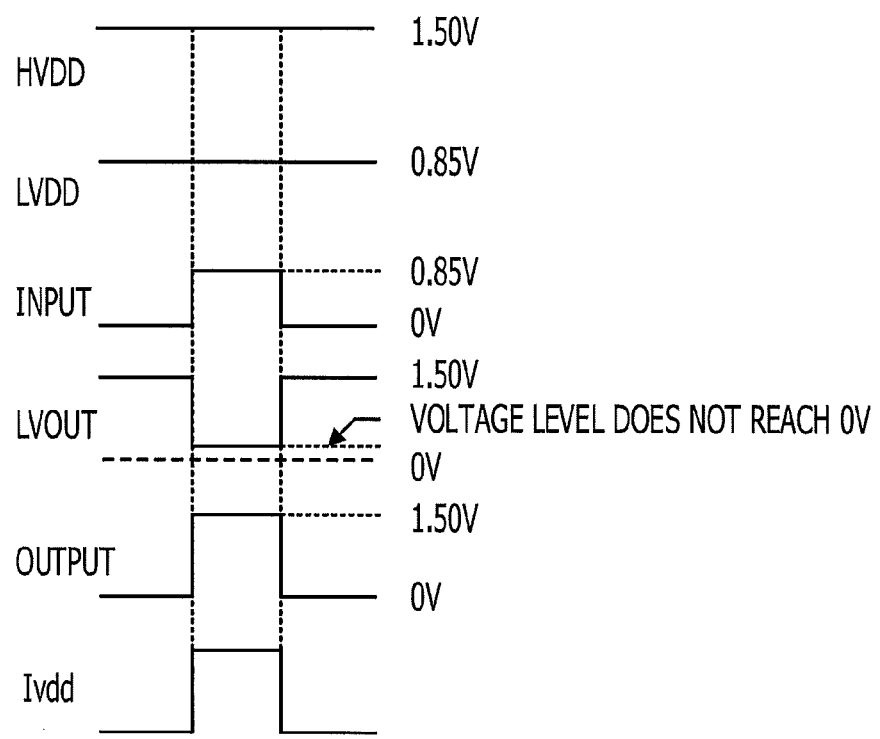

However, the through current flowing through the inverter 402 may be smaller than the through current ID flowing through the transistors 110 and 112 illustrated in FIG. 1. Unlike the level conversion circuit 102 illustrated in FIG. 1, the inverter 402 does not typically perform a high speed operation. Thus, the transistors 406 and 408 included in the inverter 402 may be formed by a transistor of which the drive performance is smaller than the drive performance of the transistor 112.

Regarding the level converter 300, despite consideration of the through current flowing in the control signal generating circuit 316, the consumption power is reduced compared to the level converter 100 illustrated in FIG. 1.

In the above-described embodiments, a case where the coupling circuit 314 is the P-channel transistor 310 has been explained as an example. However, the configuration of the coupling circuit 314 is not limited to the example. If the coupling circuit 314 has a function equivalent to the above-described P-channel transistor 310, the coupling circuit 314 may be realized by any other circuits.

[1-2. Processor]

Figure 6:
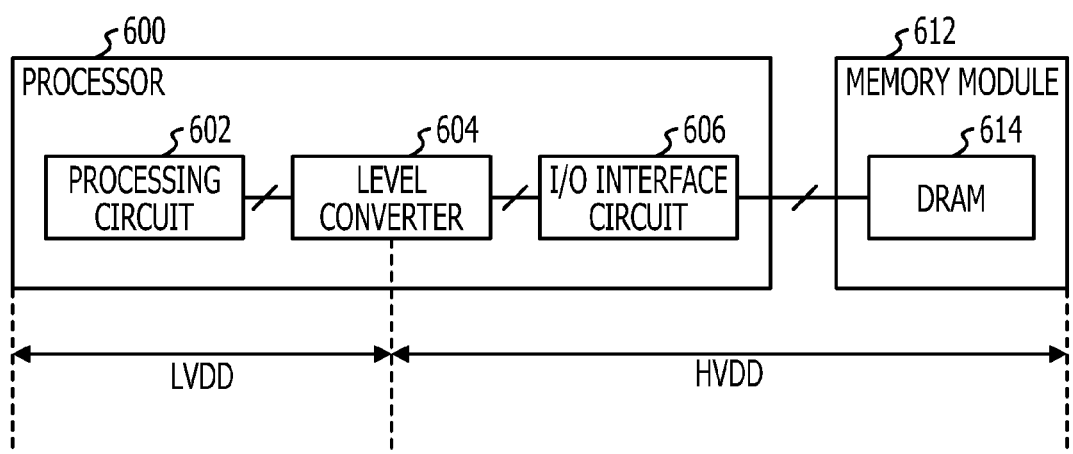
FIG. 6 is a diagram illustrating a configuration example of a processor according to the first embodiment.

The configuration of the processor according to the first embodiment will be described. FIG. 6 is a diagram illustrating a configuration example of the processor according to the first embodiment.

As illustrated in FIG. 6, a processor 600 includes a processing circuit 602, a level converter 604, and an I/O interface circuit 606. A memory module 612 includes a memory chip such as a Dynamic Random Access Memory (DRAM) chip 614.

Regarding the processor 600, the processing circuit 602 operates by being supplied with the power supply voltage level LVL from the low voltage power supply line LVDD and performs prescribed calculating processing. The processing circuit 602 is a Central Processing Unit (CPU), for example. The processing circuit 602, for example, receives data from the DRAM chip 614 in the memory module 612 and executes the calculating processing based on the received data. The processing circuit 602 outputs, from a plurality of output ports based on the calculating processing results, a signal of a plurality of bits of which the power supply voltage level LVL is the H level and the ground level GVL is the L level to the level converter 604. The signal of a plurality of bits includes, for example, writing data and a control command supplied to the DRAM chip 614 in the memory module 612 and further includes an operation mode control signal that controls the operation mode of the I/O interface circuit 606.

The level converter 604 is supplied with the power supply voltage level LVL from the low voltage power supply line LVDD, operates by being supplied with the power supply voltage level HVL from the high voltage power supply line HVDD, and receives, from the processing circuit 602, the signal of a plurality of bits of which the power supply voltage level LVL is the H level and the ground level GVL is the L level. The level converter 604 has the received signal of which the power supply voltage level HVL is the H level and includes a level conversion unit that converts the signal into a signal of which the ground level GVL is the L level for each output port of the processing circuit 602, and outputs the signal of the plurality of bits of which the power supply voltage level corresponding to each logic level is converted to the I/O interface circuit. Details of the internal part of the level converter 604 will be described below.

The I/O interface circuit 606 operates by being supplied with the power supply voltage level HVL from the high voltage power supply line HVDD and receives, from the level converter 604, the signal of a plurality of bits of which the power supply voltage level HVL is the H level and the ground level GVL is the L level.

The I/O interface circuit 606 includes a plurality of input-output operation modes and sets a prescribed input-output operation mode based on an operation mode control signal included in the received signal of a plurality of bits from among the plurality of input-output operation modes. For example, the control signal sets the operation mode of the output driver provided for each input-output port of the I/O interface circuit 606 and sets characteristics of the output driver such as an output impedance, an amount of the output voltage, and a through rate of the output signal.

The I/O interface circuit 606 is coupled to the memory module 612 through a plurality of input-output ports. The I/O interface circuit 606 transmits and receives a signal of a plurality of bits through the plurality of input-output ports to and from the memory chip in the memory module 612. For example, the I/O interface circuit 606 outputs, to the DRAM chip 614 included in the memory module 612, the writing data and the control command supplied through the level converter 604 from the processing circuit 602.

The memory module 612 includes the DRAM chip 614 and operates by being supplied with the power supply voltage level HVL from the high voltage power supply line HVDD. The DRAM chip 614 receives the writing data and the control command through a plurality of input ports from the I/O interface circuit 606 and stores the writing data in an internal part thereof based on the received control command.

Figure 7:
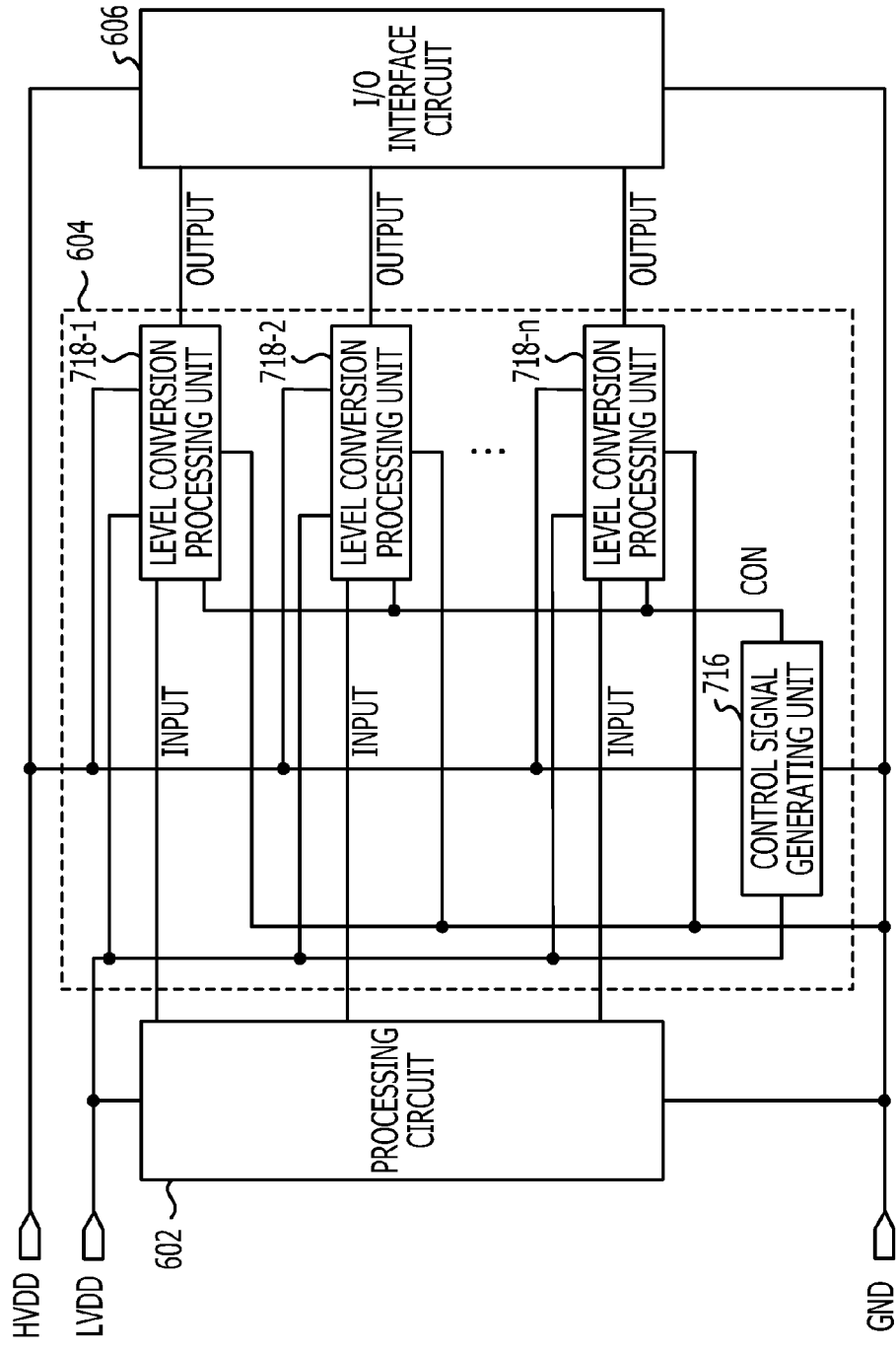
FIG. 7 is a diagram illustrating an example of an internal configuration of a level converter 604.

FIG. 7 is a diagram illustrating an example of an internal configuration of the level converter 604. As illustrated in FIG. 7, the level converter 604 includes n level conversion processing units 718 (718-1 to 718-n) and a control signal generating circuit 716. FIG. 7 illustrates the whole processor 600 for convenience sake.

The level conversion processing units 718-1 and 718-n are provided between the high voltage power supply line HVDD and the ground power supply line GND and coupled to the low voltage power supply line LVDD to receive the control signal CON. The number of level conversion processing units 718-1 to 718-n is equivalent to the number of output ports corresponding to the plurality of output ports of the processing circuit 602, and a single level conversion processing unit 718 is provided corresponding to a single output port of the processing circuit 602. The number of output ports of the processing circuit 602 is 30, for example. The internal configuration of each of the level conversion processing units 718-1 to 718-n is similar to the internal configuration of the level conversion processing unit 318 illustrated in FIG. 3. Thus, the detailed description of the operation and function of the level conversion processing unit 718 is omitted.

The control signal generating circuit 716 is provided between the high voltage power supply line HVDD and the ground power supply line GND and coupled to the low voltage power supply line LVDD. The control signal generating circuit 716 is provided commonly to the level conversion processing units 718-1 to 718-n, generates a common control signal CON, and outputs the common control signal CON to the level conversion processing units 718-1 to 718-n, respectively. The internal configuration of the control signal generating circuit 716 is similar to the internal configuration of the control signal generating circuit 316 illustrated in FIG. 4. Thus, detailed description thereof is omitted.

As with the level conversion processing unit 318 illustrated in FIG. 3, each of the level conversion processing units 718-1 to 718-n receives the common control signal CON and controls the ON state and the OFF state of the transistor, which is provided inside thereof as a coupling circuit for power supply sequence control, based on the received control signal CON.

When the high voltage power supply is in the ON state and when the low voltage power supply is in the OFF state, the processor 600 may fix the voltage level of all the output nodes OUTPUT to the ground level GVL by turning on the transistor for power supply sequence control in all the level conversion processing units 718-1 to 718-n.

Accordingly, even when the high voltage power supply is in the ON state and when the low voltage power supply is in the OFF state, the processor 600 prevents the DRAM chip 614 in the latter stage from inputting the writing data or the control command with an unstable voltage level. Thus, the DRAM chip 614 is prevented from malfunctioning, and the through current is prevented from being generated in the DRAM chip 614.

On the other hand, when both the high voltage power supply and the low voltage power supply are in the ON state, the processor 600 turns off the transistor for power supply sequence control in all the level conversion processing units 718-1 to 718-n and does not form the conduction path to the high voltage power supply line HVDD. Due to this, the through current is prevented from flowing caused by the transistor for power supply sequence control.

Therefore, when both the high voltage power supply and the low voltage power supply are in the ON state, the processor 600 prevents the increase of the consumption power caused by the through current in all the level conversion processing units 718-1 to 718-n. Due to this, compared to a case of using the level converter 100 illustrated in FIG. 1 in the level conversion processing units 718-1 to 718-n, the consumption power is reduced.

Regarding the processor 600, the level conversion processing units 718-1 to 718-n are provided corresponding to the plurality of output ports of the processing circuit 602. Due to this, as the number of level conversion processing units 718-1 to 718-n, that is, the number of output ports of the processing circuit 602 increases, the through current flowing caused by the transistor for power supply sequence control may be eliminated compared to a case where the level converter 100 illustrated in FIG. 1 is used for the level conversion processing units 718-1 to 718-n. Thus, the effect of reducing the consumption power of the processor 600 increases.

Regarding the control signal generating circuit 716, as with the control signal generating circuit 316 illustrated in FIG. 4, when both the high voltage power supply and the low voltage power supply are in the ON state, the through current flows between the high voltage power supply line HVDD and the ground power supply line GND.

As described above, however, in the processor 600, when both the high voltage power supply and the low voltage power supply are in the ON state, the through current is prevented from being generated in all the level conversion processing units 718-1 to 718-n in exchange of generation of the through current in the control signal generating circuit 716 due to the control signal CON generated by the control signal generating circuit 716.

Accordingly, even when the amount of the through current flowing in the control signal generating circuit 716 is equivalent to the amount of the through current flowing in each level conversion processing unit 718, the total amount of the generated through current may be greatly reduced in the processor 600 as a whole, so that the effect of reducing the consumption power of the whole processor 600 is improved.

For example, when the number of output ports of the processing circuit 602 is 30 and when fifteen of the output ports output the signal of the H level, if the amount of the through current flowing in the control signal generating circuit 716 is equivalent to the through current flowing in each level conversion processing unit 718, the processor 600 may reduce the total amount of the through current to less than one-fifteenth by employing the configuration illustrated in FIG. 7.

[2. Second Embodiment]

A level converter and a processor according to a second embodiment will be described below.

[2-1. Level Converter]

The circuit configuration of the control signal generating circuit of the level converter according to the second embodiment is different from the circuit configuration of the control signal generating circuit of the level converter 300 illustrated in FIG. 3. The other parts of the level converter according to the second embodiment are equivalent to the level converter 300. Thus, the description of the whole configuration of the level converter 300 is omitted. The operation and function of the parts other than the control signal generating circuit are described in FIG. 3, so that detailed description thereof is omitted.

Figure 8:
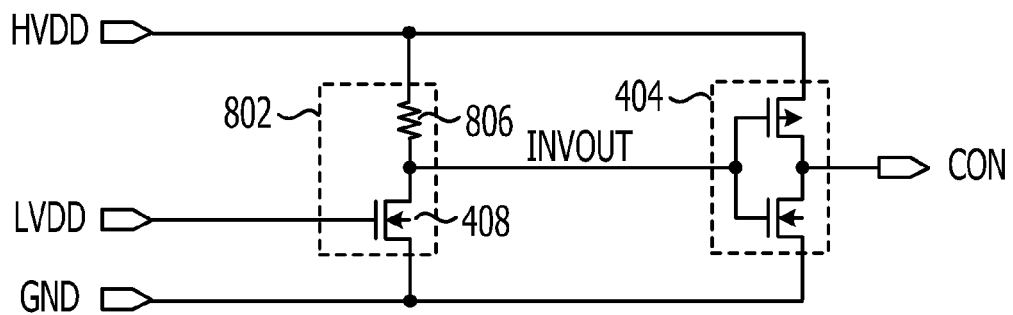
FIG. 8 is a diagram illustrating an example of a circuit configuration of a control signal generating circuit 816.

FIG. 8 is a diagram illustrating an example of a circuit configuration of the control signal generating circuit 816 provided in the level converter according to the second embodiment. The control signal generating circuit 816 illustrated in FIG. 8 is different from the control signal generating circuit 316 illustrated in FIG. 4 in that the circuit configuration of the inverter in the first stage in which the input node is coupled to the low voltage power supply line LVDD is different. The other parts are similar to each other. The parts that are similar to or corresponding to the control signal generating circuit 316 illustrated in FIG. 4 are indicated with the similar numerals. The operation and function of the parts indicated with the similar numerals in FIG. 8 are described in FIG. 4, so that detailed description thereof is omitted.

As illustrated in FIG. 8, in the control signal generating circuit 816, an inverter 802 in the first stage in which the input node is coupled to the low voltage power supply line LVDD includes a resistance element 806 and the N-channel transistor 408 provided in series between the high voltage power supply line HVDD and the ground power supply line GND and has the gate of the N-channel transistor 408 as an input node. The input node of the inverter 802 is coupled to the low voltage power supply line VLDD.

The inverter 802 receives the power supply voltage level LVL from the low voltage power supply line LVDD when the low voltage power supply is in the ON state and receives the ground level GVL when the low voltage power supply is in the OFF state. The power supply voltage level LVL to be input into the inverter 402 is a level between the power supply voltage level HVL and the ground level GVL of the high voltage power supply line HVDD coupled to the inverter 402. Therefore, the inverse threshold value of the inverter 802 is set to be lower than the intermediate level between the power supply voltage level HVL and the ground level GVL in such a way that the inverter 802 recognizes the input of the power supply voltage level LVL of the low voltage power supply line LVDD as an input of the H level and outputs a signal with the voltage level, at which the inverter 404 in the next stage is able to recognize the input of the L level, in response to the input of the power supply voltage level LVL.

The above-described inverse threshold value may be set by making the resistance value of the resistance element 806 and the value of the on-resistance of the N-channel transistor 408 included in the inverter 802 unbalanced and making the resistance of the resistance element 806 larger than the on-resistance of the N-channel transistor 408.

Thus, the inverter 802 outputs the L level to the inverter 404 in response to the input of the power supply voltage level LVL (H level) and outputs the H level to the inverter 404 in response to the input of the ground level GVL (L level).

The inverter 404 in the second stage receives the output signal of the inverter 802 and outputs the inverted signal of the received signal as the control signal CON.

Therefore, as with the control signal generating circuit 316, the control signal generating circuit 816 generates the control signal CON with the power supply voltage level HVL in response to the input of the power supply voltage level LVL (H level) and generates the control signal CON with the ground level GVL in response to the input of the ground level GVL (L level).

In the example illustrated in FIG. 8, although the number of stages of the inverter in the control signal generating circuit 816 is 2, the number of stages of the inverter may be any even number. The control signal generating circuit 816 may be realized by the inverter of any even number.

[2-2. Processor]

The processor 850 according to the second embodiment uses the control signal generating circuit 816 illustrated in FIG. 8 as the control signal generating circuit 716 in the processor 600 illustrated in FIGS. 6 and 7.

The operation and function of the processor 850 are described in FIGS. 6 and 7. Thus, detailed description thereof is omitted.

[3. Third Embodiment]

A level convertor and a processor according to a third embodiment will be described below.

[3-1. Level Converter]

Figure 9:
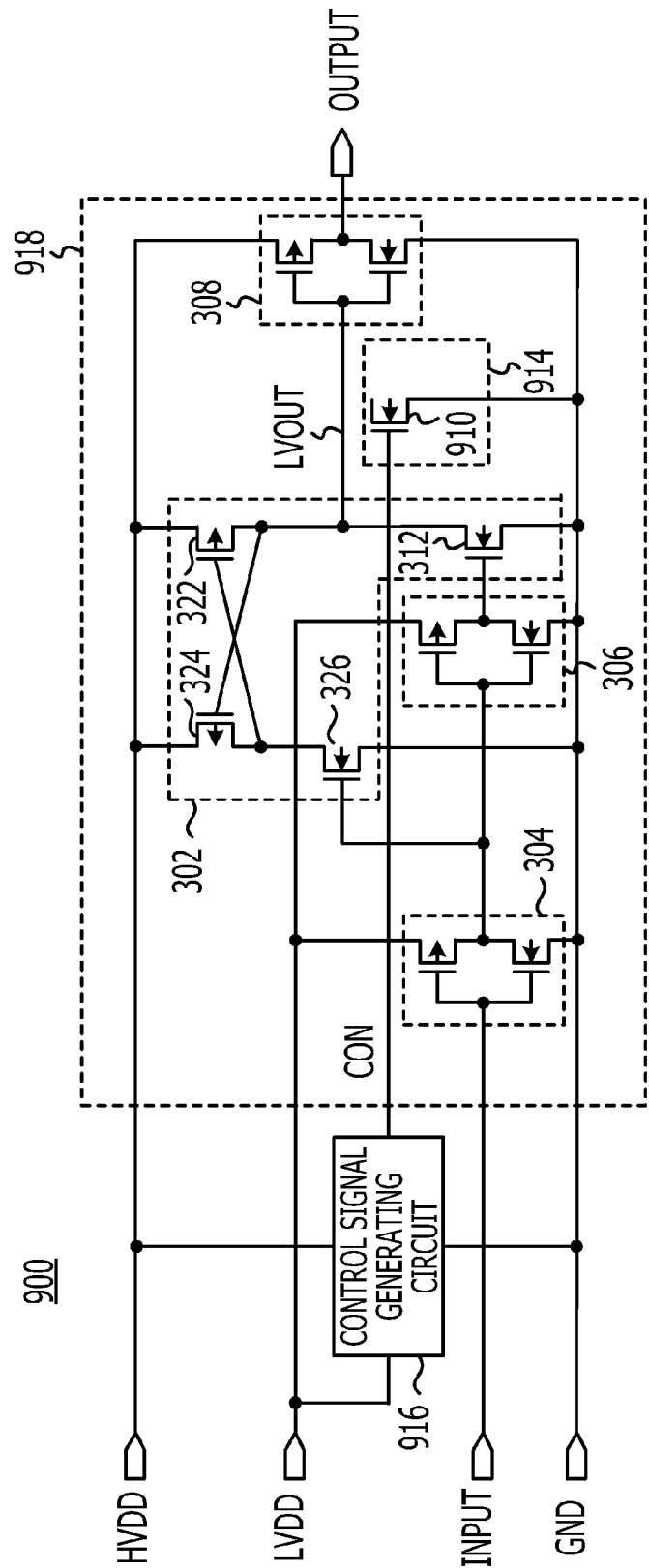
FIG. 9 is a diagram illustrating an example of a circuit configuration of a level converter according to a third embodiment.

FIG. 9 is diagram illustrating an example of a circuit configuration of the level converter according to the third embodiment.

The circuit configuration of a level converter 900 illustrated in FIG. 9 is different from the circuit configuration of the level converter 300 illustrated in FIG. 3 in that a transistor 910, a coupling circuit 914, and a level conversion processing unit 918 are provided instead of the transistor 310, the coupling circuit 314, and the level conversion processing unit 318. The other parts are similar to each other. The parts that are similar to or corresponding to the level converter 300 illustrated in FIG. 3 are indicated with the similar numerals. The operation and function of the parts indicated with the similar numerals in FIG. 9 are described in FIG. 3, so that detailed description thereof is omitted.

As illustrated in FIG. 9, the level converter 900 includes the coupling circuit 914 for power supply sequence control in the level conversion processing unit 918 to be power supply sequence free. The coupling circuit 914, which is provided between the ground power supply line GND and the output node LVOUT of the level conversion circuit 302, receives the control signal CON described below from a control signal generating circuit 916. In the example illustrated in FIG. 9, the coupling circuit 914 for power supply sequence control indicates the N-channel transistor 910 provided between the ground power supply line GND and the output node LVOUT and receives the control signal CON at the gate thereof.

The coupling circuit 914 controls whether to couple the ground power supply line GND to the output node LVOUT of the level conversion circuit 302 according to the voltage level of the control signal CON. That is, the N-channel transistor 910 provided as the coupling circuit 914 is turned on when the voltage level of the control signal CON is the power supply voltage level HVL (H level) of the high voltage power supply line HVDD and forms the conduction path between the ground power supply line GND and the output node LVOUT. Accordingly, the N-channel transistor 910 electrically couples the ground power supply line GND to the output node OUTPUT and fixes the voltage level of the output node LVOUT to the ground level GVL of the ground power supply line GND.

Since the voltage level of the input node of the inverter 308 is fixed to the ground level GVL, the voltage level of the output signal is fixed to the power supply voltage level HVL in the output node OUTPUT of the level converter 900.

On the other hand, the N-channel transistor 910 provided as the coupling circuit 914 is turned off when the voltage level of the control signal CON is the ground level GVL (L level) and does not form the conduction path between the ground power supply line GND and the output node LVOUT. As a result, the N-channel transistor 910 electrically separates the ground power supply line GND from the output node LVOUT.

The control signal generating circuit 916 is provided between the high voltage power supply line HVDD and the ground power supply line GND and coupled to the low voltage power supply line LVDD. The control signal generating circuit 916 operates when the high voltage power supply coupled to the high voltage power supply line HVDD is turned on, generates the control signals CON with different voltage levels according to the voltage level of the low voltage power supply line LVDD, and supplies the generated control signals to the N-channel transistor 910 provided as the coupling circuit 914.

The control signal generating circuit 916 generates the control signal with the ground level GVL (L level) of the ground power supply line GND when both the high voltage power supply and the low voltage power supply are in the ON state and when the voltage level of the low voltage power supply line LVDD is the power supply voltage level LVL. When the high voltage power supply is in the ON state, when the low voltage power supply is in the OFF state, and when the voltage level of the low voltage power supply line LVDD is the ground level GVL, the control signal generating circuit 316 generates the control signal with the power supply voltage level HVL (H level) of the high voltage power supply line HVDD.

Figure 10:
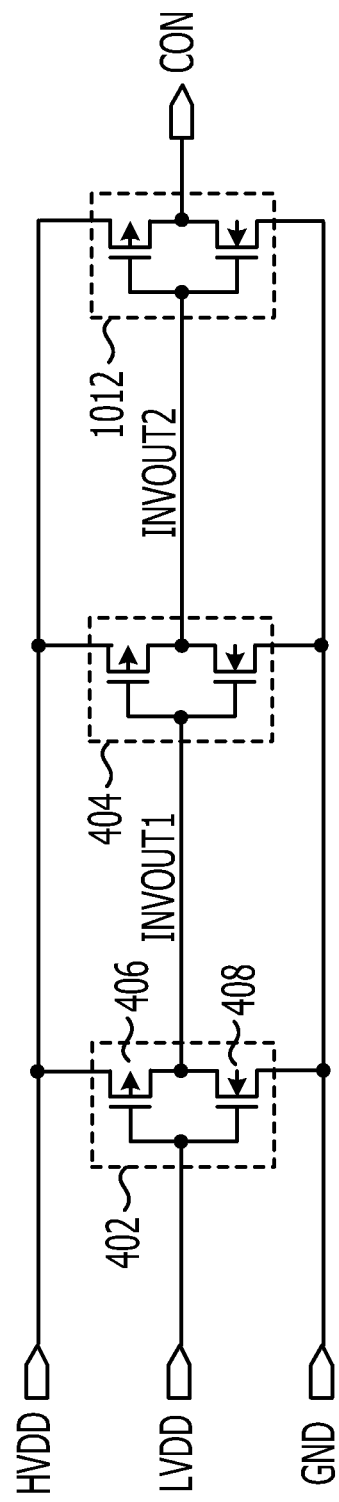
FIG. 10 is a diagram illustrating an example of a circuit configuration of a control signal generating circuit 916.

FIG. 10 is a diagram illustrating an example of a circuit configuration of the control signal generating circuit 916. The control signal generating circuit 916 illustrated in FIG. 10 is different from the control signal generating circuit 316 illustrated in FIG. 4 in that an inverter 1012 in the third stage is added. The other parts of the control signal generating circuit 916 are equivalent to the control signal generating circuit 316.

The parts of the control signal generating circuit 316 that are similar to or corresponding to the control signal generating circuit 316 are indicated with the similar numerals. In FIG. 10, the operation and function of the parts indicated with the similar numerals are described in FIG. 4, so that detailed description thereof is omitted.

As illustrated in FIG. 10, the control signal generating circuit 916 includes three inverters 402, 404, and 1012 provided between the high voltage power supply line HVDD and the ground power supply line GND.

Regarding the inverter 402 in the first stage, the input node is coupled to the low voltage power supply line LVDD. Therefore, as with the control signal generating circuit 316, the inverse threshold value is set to be lower than the intermediate level between the power supply voltage level HVL and the ground level GVL in such a way that the inverter 402 recognizes the input of the power supply voltage level LVL of the low voltage power supply line LVDD as the input of the L level and outputs a signal with a voltage level, at which the inverter 404 in the next stage is able to recognize the input of the L level, in response to the input of the power supply voltage level LVL.

The inverter 402 outputs the L level to the inverter 404 in response to the input of the power supply voltage level LVL (H level) and outputs the H level to the inverter 404 in response to the input of the ground level GVL (L level).

The inverter 404 in the second stage receives the output signal of the inverter 402 and outputs the inverted signal of the received signal to the inverter 1012.

The inverter 1012 in the third stage receives the output signal of the inverter 404 and outputs the inverted signal of the received signal as the control signal CON.

Therefore, the control signal generating circuit 916 generates the control signal CON with the ground level GVL in response to the input of the power supply voltage level LVL (H level) and generates the control signal CON with the power supply voltage level HVL in response to the input of the ground level GVL (L level).

In the example illustrated in FIG. 10, although the number of stages of the inverters of the control signal generating circuit 916 is 3, the number of stages of the inverters may be any odd number.

In the control signal generating circuit 916, the inverter 402 in the first stage may be replaced by the inverter 802 in the first stage in the control signal generating circuit 916 illustrated in FIG. 8.

As described above, regarding the control signal generating circuit 916, when the high voltage power supply is in the ON state due to the control signal generating circuit 916 and the N-channel transistor 910 provided as the coupling circuit 914 for power supply sequence control. When the low voltage power supply is in the OFF state, the voltage level of the output node LVOUT of the level conversion circuit 302 is fixed to the ground level GVL of the ground power supply line GND, and the voltage level of the output node OUTPUT is fixed to the power supply voltage level HVL of the high voltage power supply line HVDD.

Accordingly, when the high voltage power supply is in the ON state and when the low voltage power supply is in the OFF state, the level converter 900 may fix the voltage level of the output node OUTPUT to the voltage level that is different from a case of the level converter 300 illustrated in FIG. 3.

Regarding the level converter 900, when both the high voltage power supply and the low voltage power supply are in the ON state, the transistor 910 for power supply sequence transistor is completely turned off. Therefore, when the voltage level of the input signal supplied to the input node INPUT is the L level (ground level GVL), the through current is prevented from flowing between the high voltage power supply line HVDD and the ground power supply line GND through the transistors 322 and 910 even when the transistor 322 provided between the output node OUTPUT and the high voltage power supply line HVDD is turned on.

Regarding the level converter 900, the consumption current is prevented from increasing due to the through current caused by the transistor provided as the coupling circuit for power supply sequence control. Therefore, compared to the level converter 100 illustrated in FIG. 1, the consumption power is reduced.

In the above-described embodiments, although the coupling circuit 914 as the N-channel transistor 910 is described as an example, the configuration of the coupling circuit 914 is not limited to the example. If the coupling circuit 914 includes the function that is equivalent to the above-described N-channel transistor 910, the coupling circuit 914 may be realized by any other circuits.

[3-2. Processor]

A processor 950 according to the second embodiment uses the level conversion processing unit 918 as the level conversion processing units 718-1 to 718-n in the processor 600 illustrated in FIGS. 6 and 7 and uses the control signal generating circuit 916 illustrated in FIG. 10 as the control signal generating circuit 716.

When the high voltage power supply is in the ON state and when the low voltage power supply is in the OFF state, the operation and function of the processor 950 are equivalent to the description of FIGS. 6 and 7 with the exception that the voltage levels at which the output node OUTPUT of the level conversion processing units are fixed are different from each other. Thus, detailed description thereof is omitted.

[4. Fourth Embodiment]

Figure 11:
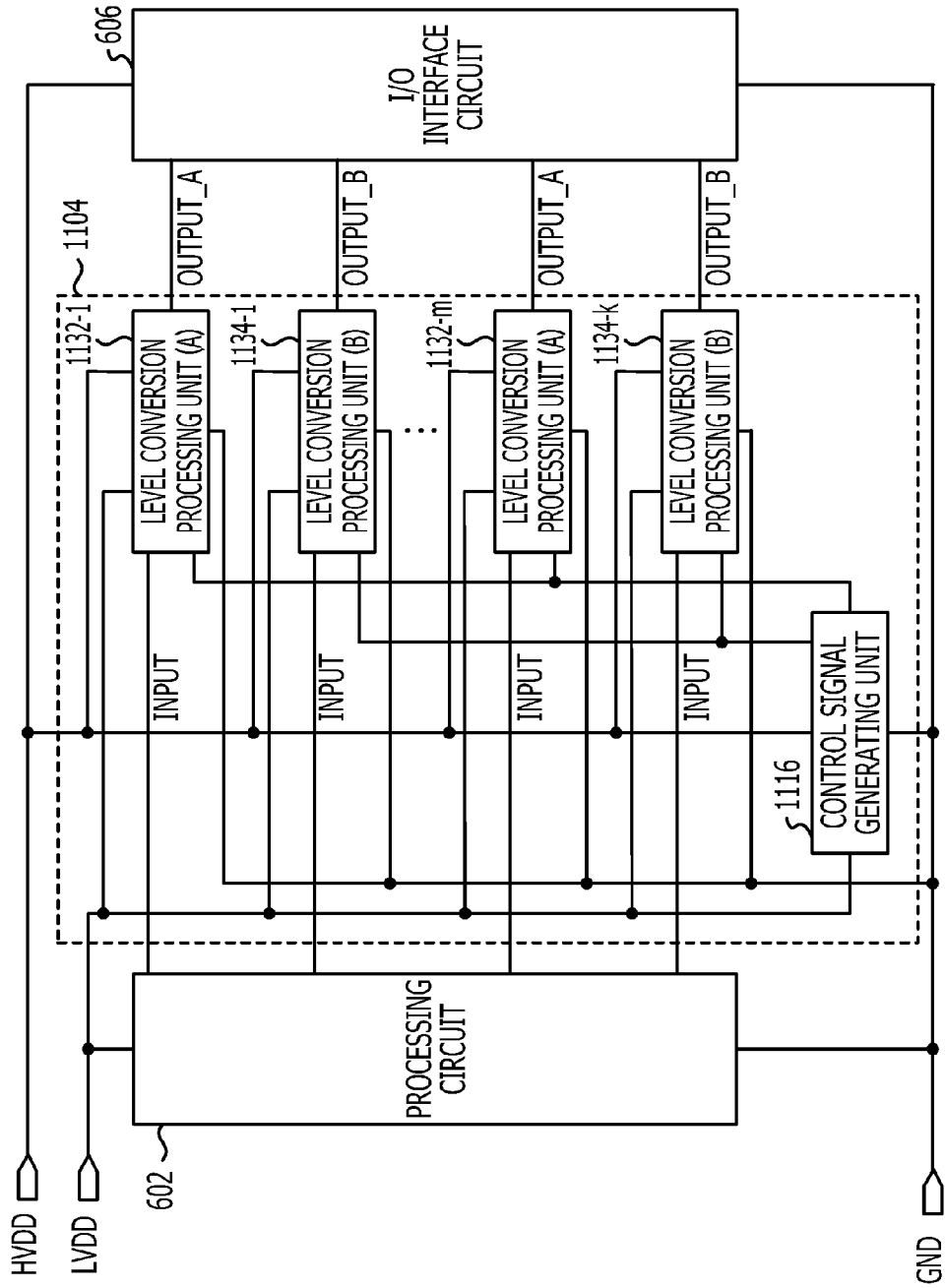
FIG. 11 is a diagram illustrating an example of an internal configuration of a processor according to a fourth embodiment.

A processor according to a fourth embodiment will be described below. FIG. 11 is a diagram illustrating an example of an internal configuration of the processor according to the fourth embodiment.

Although the processor 1100 illustrated in FIG. 11 is different from the processor 600 illustrated in FIGS. 6 and 7 in that a level converter 1104 is provided instead of the level converter 604, the other parts of the processor 1100 are equivalent to the processor 600. The parts of the processor 1100 that are similar to or corresponding to the parts of the processor 600 illustrated in FIGS. 6 and 7 are indicated with the similar numerals. In FIG. 11, the operation and function of the parts indicated with the similar numerals are described in FIGS. 6 and 7, so that detailed description thereof is omitted.

As described in FIG. 11, the level converter 1104 includes m level conversion processing units (A) 1132 (1132-1 to 1132-m), k level conversion processing units (B) 1134 (1134-1 to 1134-k), and a control signal generating circuit 1116.

The level converter 1104 includes a plurality of level conversion processing units belonging to a group A or a group B. Regarding the level converter 1104, as with the level conversion processing units 718-1 to 718-n illustrated in FIG. 7, the number of level conversion processing units to be provided is equivalent to the number of output ports corresponding to the output ports of the processing circuit 602. Each of the level conversion processing units belongs to either a group A or a group B. The number of the output ports of the processing circuit 602 is 30, for example. In this case, the total number of the level conversion processing units belonging to the group A and the group B is 30 as well.

The group A includes m level conversion processing units (A). Each of the level conversion processing units (A) 1132-1 to 1132-n belonging to the group A is provided between the high voltage power supply line HVDD and the ground power supply line GND and coupled to the low voltage power supply line LVDD to receive a control signal CON_A. The internal configuration of each of the level conversion processing units (A) 1132-1 to 1132-m is equivalent to the internal configuration of the level conversion processing unit 318 illustrated in FIG. 3.

The group B includes k level conversion processing units (B). Each of the level conversion processing units (B) 1134-1 to 1134-k belonging to the group B is provided between the high voltage power supply line HVDD and the ground power supply line GND and coupled to the low voltage power supply line LVDD to receive a control signal CON_B. The internal configuration of each of the level conversion processing units (B) 1134-1 to 1134-k is equivalent to the internal configuration of the level conversion processing unit 918 illustrated in FIG. 9.

The control signal generating circuit 1116 is provided between the high voltage power supply line HVDD and the ground power supply line GND and coupled to the low voltage power supply line LVDD. The control signal generating circuit 1116 is provided commonly to the level conversion processing units (A) 1132-1 to 1132-m belonging to the group A and the level conversion processing units (B) 1134-1 to 1134-k belonging to the group B.

The control signal generating circuit 1116 generates the control signal CON_A that is common to the level conversion processing units (A) 1132-1 to 1132-m and outputs the control signal CON_A to the respective level conversion processing units (A) 1132-1 to 1132-m. Further, the control signal generating circuit 1116 generates the control signal CON_B that is common to the level conversion processing units (B) 1134-1 to 1134-k and outputs the control signal CON_B to the respective level conversion processing units (B) 1134-1 to 1134-m.

When both the high voltage power supply and the low voltage power supply are in the ON state and when the voltage level of the low voltage power supply line LVDD is the power supply voltage level LVL, the control signal generating circuit 1116 generates the control signal CON_A with the power supply voltage level HVL (H level) of the high voltage power supply line HVDD and generates the control signal CON_B with the ground level GVL (L level) of the ground power supply line GND. Further, when the high voltage power supply is in the ON state, the low voltage power supply is in the OFF state, and the voltage level of the low voltage power supply line LVDD is the ground level GVL, the control signal generating circuit 316 generates the control signal CON_A with the ground level GVL (L level) and generates the control signal CON_B with the power supply voltage level HVL (H level).

Figure 12:
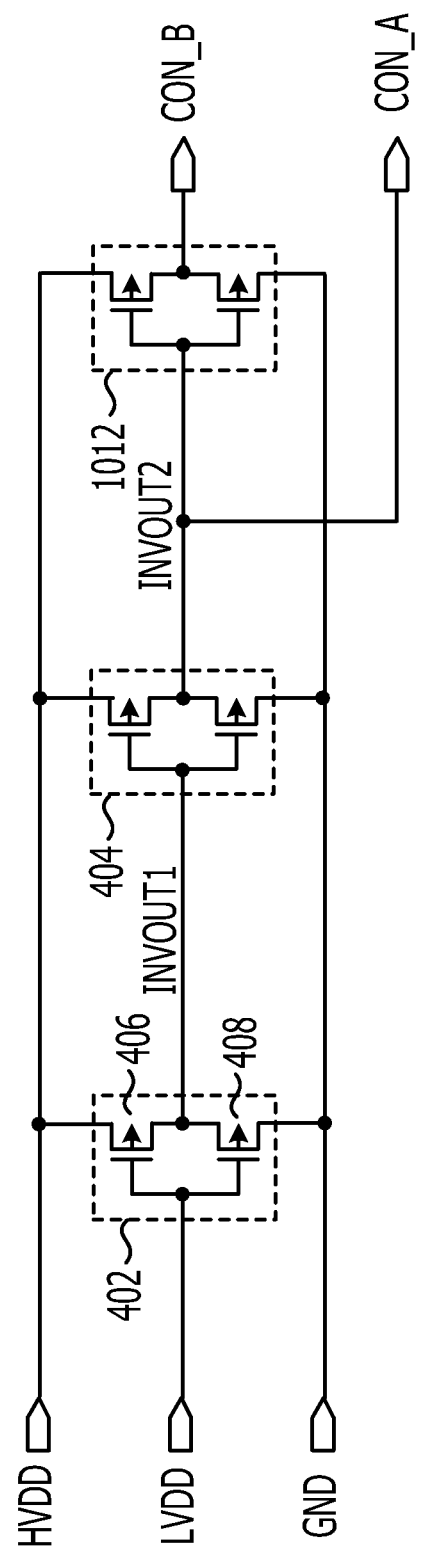
FIG. 12 is a diagram illustrating an example of a circuit configuration of a control signal generating circuit 1116.

FIG. 12 is a diagram illustrating an example of the circuit configuration of the control signal generating circuit 1116 provided in the level converter 1104. The control signal generating circuit 1116 illustrated in FIG. 12 is different from the control signal generating circuit 916 illustrated in FIG. 10 in that the output node of the inverter 404 in the second stage outputs the control signal. The other parts are similar to each other. The parts of the control signal generating circuit 1116 that are similar to or corresponding to the control signal generating circuit 916 are indicated with the similar numerals. The operation and function of the parts indicated with the similar numerals illustrated in FIG. 12 are described in FIGS. 4 and 10, so that detailed description thereof is omitted.

Regarding the inverter 402 in the first stage, the input node is coupled to the low voltage power supply line LVDD. As a result, as with the control signal generating circuit 316, the inverse threshold value is set to be lower than the intermediate level between the power supply voltage level HVL and the ground level GVL in such a way that the inverter 402 recognizes the input of the power supply voltage level LVL of the low voltage power supply line LVDD as the input of the H level and that outputs a signal with a voltage level, at which the inverter 404 in the next stage is able to recognize the input of the L level, in response to the input of the power supply voltage level LVL.

The inverter 404 in the second stage receives the output signal of the inverter 402 and outputs the inverted signal of the received signal as the control signal CON_A.

The inverter 1012 in the third stage receives the output signal of the inverter 404 and outputs the inverted signal of the received signal as the control signal CON_B.

The control signal generating circuit 1116 generates the control signal CON_A with the power supply voltage level HVL in response to the input of the power supply voltage level LVL (H level) and generates the control signal CON_B with the ground level GVL.

The control signal generating circuit 1116 generates the control signal CON_A with the ground level GVL in response to the input of the ground level GVL (L level) and generates the control signal CON_B with the power supply voltage level HVL.

In the example illustrated in FIG. 12, although the number of stages of the inverters of the control signal generating circuit 1116 is 3, the number may be any plural number. The control signal generating circuit 1116 outputs the output signal of the inverter in the stage of an even number as the control signal CON_A and outputs the output signal of the inverter in the stage of an odd number as the control signal CON_B.

Regarding the control signal generating circuit 1116, the inverter 402 in the first stage may be replaced by the inverter 802 in the first stage of the control signal generating circuit 916 illustrated in FIG. 8.

FIG. 11 will be described below. As with the level conversion processing unit 318, based on the received control signal CON_A, each of the level conversion processing units (A) 1132-1 to 1132-m controls the ON state and the OFF state of the transistor provided inside thereof as the coupling circuit for power supply sequence control.

When the high voltage power supply is in the ON state and when the low voltage power supply is in the OFF state, the processor 1100 fixes the voltage level of all output nodes OUTPUT_A to the ground level GVL of the ground power supply line GND by turning on the transistor for power supply sequence control in all of the level conversion processing units (A) 1132-1 to 1132-m.

As with the level conversion processing unit 918, based on the received control signal CON_A, each of the level conversion processing units (B) 1134-1 to 1134-k controls the ON state and the OFF state of the transistor provided inside thereof as a coupling circuit for power supply sequence control.

When the high voltage power supply is in the ON state and when the low voltage power supply is in the OFF state, the processor 1100 fixes the voltage level of all output nodes OUTPUT_B to the power supply voltage level HVL of the high voltage power supply line HVDD by turning on the transistor for power supply sequence control in all the level conversion processing units (B) 1134-1 to 1134-k.

Accordingly, even when the high voltage power supply is in the ON state and when the low voltage power supply is in the OFF state, the processor 1100 prevents the DRAM chip 614 in the latter stage from inputting the writing data of which the voltage level is unstable and the control command. As a result, the DRAM chip 614 is prevented from malfunctioning, and the through current is prevented from being generated in the DRAM chip 614.

In addition, the processor 1100 properly selects either the level conversion processing unit (A) belonging to the group A or the level conversion processing unit (B) belonging to the group B for each output port of the processing circuit 602 and allocates the level conversion processing units 1132-1 to 1132-m and 1134-1 to 1134-k. Due to this, when the high voltage power supply is in the ON state while the low voltage power supply is in the OFF state, each bit of the signal output to the DRAM chip 614 in the latter stage may be fixed to either the H level or the L level.

Therefore, when the high voltage power supply is in the ON state and when the low voltage power supply is in the OFF state, the processor 1100 optimizes the contents of the signal output to the DRAM chip 614 in the latter stage in bit unit, so that the DRAM chip 614 is prevented from malfunctioning and the through current is surely prevented from being generated in the DRAM chip 614. For example, if the contents of the signal output to the DRAM chip 614 in the latter stage are stored as a control command that may be recognized by the DRAM chip 614, the DRAM chip 614 is surely prevented from malfunctioning.

On the other hand, when both the high voltage power supply and the low voltage power supply are in the ON state, the processor 1100 turns off the transistor for power supply sequence control in all the level conversion processing units (A) 1132-1 to 1132-m, does not form the conduction path to the high voltage power supply line HVDD, turns off the transistor for power supply sequence control, and does not form the conduction path to the ground power supply line GND.

As a result, as with the processor 600, in the processor 1100, the through current is prevented from flowing due to the transistor for power supply sequence control in all the level conversion processing units 1132-1 to 1132-m and 1134-1 to 1134-k.

Accordingly, when both the high voltage power supply and the low voltage power supply are in the ON state, the overall consumption power of the processor 600 is reduced compared to the case where the level converter 100 illustrated in FIG. 1 is used in the level conversion processing units 1132-1 to 1132-m and 1134-1 to 1134-k.

As described above, although the level converter and the processor according to the embodiments as example of the present invention have been described, it should be understood that the various changes, substitutions, and alterations could be made hereto without departing from the spirit and scope of the invention. The techniques disclosed in the embodiments may be combined if necessary as long as there is no mutual contradiction.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the spirit and scope of the invention.

What is claimed is:

1. A level converter comprising:
   a reference power supply line which has a reference voltage level;
   a level conversion circuit which has an output node, which is provided between the reference power supply line and a first power supply line, which inputs a first signal and outputs a second signal from the output node, the first power supply line being coupled to a first power supply outputting a first voltage level that is higher than the reference voltage level, the first signal having a first logic level that is a second voltage level that is lower than the first voltage level and is higher than the reference voltage level, and a second logic level that is the reference voltage level and is lower than the first logic level, the second signal having a first logic level that is the first voltage level and a second logic level that is the reference voltage level;
   a control signal generating circuit to output a control signal, the control signal having the reference voltage level when a second power supply outputting the second voltage level is turned off and the first voltage level when the second power supply is turned on, wherein the second power supply is external to the level converter and connects with the level converter via a second supply line; and
   a coupling circuit to control an electrically connection between the first power supply line and the output node of the level conversion circuit based on the control signal.

2. The level converter according to claim 1, wherein the control signal generating circuit includes inverters in even-numbered stages,
   wherein each of the inverters in the even-numbered stages includes a P-channel transistor and an N-channel transistor which are coupled in series between the first power supply line and the reference power supply line,
   wherein an input node of the inverter in a first stage from among the inverters in the even-numbered stages is couple to the second power supply line coupled to the second power supply, and
   wherein an on-resistance of the P-channel transistor is larger than the on-resistance of the N-channel transistor in the inverter in the first stage.

3. The level converter according to claim 2, wherein when the voltage level of the input node is the second voltage level, the inverter in the first stage recognizes the input of the first logic level and generates an output signal with the voltage level at which the inverter in the second stage from among the inverters in the even-numbered stages is able to recognize the input of the second logic level.

4. The level converter according to claim 2, wherein regarding the inverter in the first stage, a gate length of the P-channel transistor is longer than the gate length of the N-channel transistor.

5. The level converter according to claim 2, wherein regarding the inverter in the first stage, a gate width of the P-channel transistor is narrower than the gate width of the N-channel transistor.

6. The level converter according to claim 1, wherein the control signal generating circuit includes inverters in even-numbered stages,
   wherein the inverter in a first stage from among the inverters in the even-numbered stages includes a resistance element and an N-channel transistor which are coupled in series between the first power supply line and the reference power supply line, wherein a gate of the N-channel transistor included in the inverter in the first stage is coupled to the second power supply line coupled to the second power supply, wherein the inverter in one of a second stage and a following stage thereof from among the inverters in the even-numbered stages includes a P-channel transistor and the N-channel transistor which are coupled in series between the first power supply line and the reference power supply line, and wherein regarding the inverter in the first stage, a resistance of a resistance element is larger than an on-resistance of the N-channel transistor.

7. The level converter according to claim 1, wherein the coupling circuit includes a P-channel transistor which receives the control signal at a gate thereof.

8. The level converter according to claim 1, wherein the level conversion circuit comprising:
 a first P-channel transistor of which a source is coupled to the first power supply line;
 a second P-channel transistor of which the source is coupled to the first power supply line, a drain is coupled to a gate of the first P-channel transistor, and the gate is coupled to the drain of the first P-channel transistor;
 a first N-channel transistor of which the source is coupled to the reference power supply line and the drain is coupled to the drain of the first P-channel transistor; and
 a second N-channel transistor of which the source is coupled to the reference power supply line and the drain is coupled to the drain of the second P-channel transistor, and
 wherein a non-inverted signal and an inverted signal of the input signal are differentially input into the gate of the first N-channel transistor and the second N-channel transistor.

9. A level converter comprising:
 a reference power supply line which has a reference voltage level;
 a level conversion circuit which has an output node, which is provided between the reference power supply line and a first power supply line, which inputs a first signal and outputs a second signal from the output node, the first power supply line being coupled to a first power supply outputting a first voltage level that is higher than the reference voltage level, the first signal having a first logic level that is a second voltage level that is lower than the first voltage level and is higher than the reference voltage level, and a second logic level that is the reference voltage level and is lower than the first logic level, the second signal having a first logic level that is the first voltage level and a second logic level that is the reference voltage level;
 a control signal generating circuit to output a control signal, the control signal having the first voltage level when a second power supply outputting the second voltage level is turned off and the reference voltage level when the second power supply is turned on, wherein the second power supply is external to the level converter and connects with the level converter via a second supply line; and
 a coupling circuit to control an electrically connection between the reference power supply line and the output node of the level conversion circuit based on the control signal.

10. The level converter according to claim 9, wherein the control signal generating circuit include inverters in odd-numbered stages, wherein each of the inverters in the odd-numbered stages includes a P-channel transistor and an N-channel transistor which are coupled in series between the first power supply line and the reference power supply line, wherein the input node of the inverter in the first stage from among the inverters in the odd-numbered stages is coupled to the second power supply line coupled to the second power supply, and wherein regarding the inverter in the first stage, an on-resistance of the P-channel transistor is larger than the on-resistance of the N-channel transistor.

11. The level converter according to claim 10, wherein when the voltage level of the input node is the second voltage level, the inverter in the first stage recognizes the input of the first logic level and generates an output signal with the voltage level at which the inverter in the second stage from among the inverters in the odd numbered stages is able to recognize the input of the second logic level.

12. The level converter according to claim 10, wherein regarding the inverter in the first stage, the gate length of the P-channel transistor is longer than the gate length of the N-channel transistor.

13. The level converter according to claim 10, wherein regarding the inverter in the first stage, the gate width of the P-channel transistor is narrower than the gate width of the N-channel transistor.

14. The level converter according to claim 9, wherein
 the control signal generating circuit includes inverters in odd-numbered stages,
 wherein the inverter in the first stage from among the inverters in the even-numbered stages includes a resistance element and the N-channel transistor which are coupled in series between the first power supply line and the reference power supply line,
 wherein the gate of the N-channel transistor included in the inverter in the first stage is coupled to the second power supply line coupled to the second power supply,
 wherein the inverter in one of the second stage and a following stage thereof includes the P-channel transistor and the N-channel transistor which are coupled in series between the first power supply line and the reference power supply line, and
 wherein regarding the inverter in the first stage, the resistance of the resistance element is larger than the on-resistance of the N-channel transistor.

15. The level converter according to claim 9, wherein the coupling circuit is an N-channel transistor which receives the control signal at a gate thereof.

16. The level converter according to claim 9, the level conversion circuit, comprising:
 a first P-channel transistor of which a source is coupled to the first power supply line;
 a second P-channel transistor of which the source is coupled to the first power supply line, a drain is coupled to a gate of the first P-channel transistor, and the gate is coupled to the drain of the first P-channel transistor;
 a first N-channel transistor of which the source is coupled to the reference power supply line and the drain is coupled to the drain of the first P-channel transistor; and
 a second N-channel transistor of which the source is coupled to the reference power supply line and the drain is coupled to the drain of the second P-channel transistor, and
 wherein a non-inverted signal and an inverted signal of the input signal are differentially input into the gate of the first N-channel transistor and the second N-channel transistor.

17. A processor, comprising:
a reference power supply line which has a reference voltage level;
a plurality of level conversion circuit, wherein each level conversion circuit has an output node, which is provided between the reference power supply line and a first power supply line, which inputs a first signal and outputs a second signal from the output node, the first power supply line being coupled to a first power supply outputting a first voltage level that is higher than the reference voltage level, the first signal having a first logic level that is a second voltage level that is lower than the first voltage level and is higher than the reference voltage level, and a second logic level that is the reference voltage level and is lower than the first logic level, the second signal having a first logic level that is the first voltage level and a second logic level that is the reference voltage level;
a processing circuit which executes a procedure, which is provided between a second power supply line coupled to a second power supply outputting the second voltage level and the reference power supply line, which outputs a plurality of the first signals to a plurality of the level conversion circuits, wherein the second power supply is external to the processor and connects with the processor via the second supply line;
a control signal generating circuit which outputs a control signal and is provided for a plurality of the level conversion circuits, the control signal having the reference voltage level when the second power supply outputting the second voltage level is turned off and the first voltage level when the second power supply is turned on; and
a plurality of coupling circuits, wherein each coupling circuit controls an electrically connection between the first power supply line and the output node of the level conversion circuit based on the control signal.

18. A processor, comprising:
a reference power supply line which has a reference voltage level;
a plurality of level conversion circuit, wherein each level conversion circuit has an output node, which is provided between the reference power supply line and a first power supply line, which inputs a first signal and outputs a second signal from the output node, the first power supply line being coupled to a first power supply outputting a first voltage level that is higher than the reference voltage level, the first signal having a first logic level that is a second voltage level that is lower than the first voltage level and is higher than the reference voltage level, and a second logical level that is lower than the first logical level, the second signal having a first logical level that is the first voltage level and a second logical level that is the reference voltage level;
a control signal generating circuit which outputs a control signal and is provided for a plurality of the level conversion circuits, the control signal having the reference voltage level when a second power supply outputting the second voltage level is turned off and the first voltage level when the second power supply is turned on, wherein the second power supply is external to the processor and connects with the processor via a second supply line; and
a plurality of coupling circuits, wherein each coupling circuit controls an electrically connection between the first power supply line and the output node of the level conversion circuit based on the control signal.

19. A processor, comprising:
a reference power supply line which has a reference voltage level;
a plurality of first level conversion circuits belonging to a first group, wherein each first level conversion circuit has a first output node, which is provided between the reference power supply line and a first power supply line, which inputs a first signal and outputs a second signal from the first output node, the first power supply line being coupled to a first power supply outputting a first voltage level that is higher than the reference voltage level, the first signal having a first logic level that is a second voltage level that is lower than the first voltage level and is higher than the reference voltage level, and a second logical level that is the reference voltage level and is lower than the first logical level, the second signal having a first logical level that is the first voltage level and a second logical level that is the reference voltage level;
a plurality of second level conversion circuits belonging to a second group, wherein each second level conversion circuit has a second output node, which is provided between the reference power supply line and the first power supply line, which inputs a third signal and outputs a fourth signal from the second output node, the third signal having a first logic level that is the second voltage level and a second logic level that is the reference voltage level and is lower than the first logic level, the fourth signal having a first logic level that is the first voltage level and a second logic level that is the reference voltage level;
a processing circuit which executes a procedure, which is provided between a second power supply line coupled to a second power supply outputting the second voltage level and the reference power supply line, which outputs a plurality of the first signals to a plurality of the first level conversion circuits, and which outputs a plurality of the third signals to a plurality of the second level conversion circuits, wherein the second power supply is external to the processor and connects with the processor via the second supply line;
a control signal generating circuit which outputs a first control signal and a second control signal, and which is provided for the first group and the second group, the first control signal having the reference voltage level when the second power supply is turned off and the first voltage level when the second power supply is turned on, the second control signal having the first voltage level when the second power supply is turned off and the reference voltage level when the second power supply is turned on;
a plurality of first coupling circuits, provided for a plurality of the first level conversion circuits, wherein each first coupling circuit controls an electrically connection between the first power supply line and the first output node of the first level conversion circuit based on the first control signal; and
a plurality of second coupling circuits, provided for a plurality of the second level conversion circuits, wherein each second coupling circuit controls an electrically connection between the second power supply line and the second output node of the second level conversion circuit based on the second control signal.

20. The processor according to claim 19, wherein the control signal generating circuit includes inverters in a plurality of stages,
wherein each of the inverters in the plurality of stages includes a P-channel transistor and an N-channel transistor which are coupled in series between the first power supply line and the reference power supply line, wherein the input node in the first stage from among the inverters in the plurality of stages, wherein the on-resistance of the P-channel transistor is larger than the on-resistance of the N-channel transistor in the inverter in the first stage, and wherein the control signal generating circuit outputs the first control signal from the inverter in the even-numbered stage from among the inverters in the plurality of stages and outputs the second control signal from the inverter in the odd-numbered stage from among the inverters in the plurality of stages.

* * * * *